United States Patent
Morita et al.

(10) Patent No.: US 10,250,342 B2
(45) Date of Patent: Apr. 2, 2019

(54) SYSTEM FOR MEASURING RECEPTION PERFORMANCE OF WIRELESS TERMINAL AND METHOD OF MEASUREMENT

(71) Applicant: ANRITSU CORPORATION, Kanagawa (JP)

(72) Inventors: Tomonori Morita, Kanagawa (JP); Aya Yamamoto, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 16/048,661

(22) Filed: Jul. 30, 2018

(65) Prior Publication Data

US 2019/0044628 A1    Feb. 7, 2019

(30) Foreign Application Priority Data

Aug. 1, 2017   (JP) .................. 2017-149406

(51) Int. Cl.
*H04B 17/00*       (2015.01)
*H04W 24/00*       (2009.01)
(Continued)

(52) U.S. Cl.
CPC ......... *H04B 17/29* (2015.01); *G01R 29/0871* (2013.01); *G01R 29/0892* (2013.01)

(58) Field of Classification Search
CPC ..... H04W 4/026; H04W 24/06; H04W 88/02; H04B 1/16; H04B 3/46; H04B 17/0085;
(Continued)

(56) References Cited

U.S. PATENT DOCUMENTS 5,987,312 A  * 11/1999  Dekker ............... H03F 3/45479
                                                    455/115.1
7,035,594 B2 *  4/2006  Wallace ................... H01Q 3/26
                                                    455/425
(Continued)

OTHER PUBLICATIONS

"Antenna Engineering Handbook, the fifth impression of the first edition: pp. 439 to 446", The Institute of Electronics, Information and Communication Engineers: Ohmsha, Ltd, Dec. 30, 1989.

(Continued)

*Primary Examiner* — Quochien B Vuong
(74) *Attorney, Agent, or Firm* — Pearne & Gordon LLP

(57) ABSTRACT

In a measuring system in which a wireless terminal that is a measurement target is rotated centering around the standard point O at each rotation angle of the wireless terminal, and thus a reception performance is acquired, when the reception performance is obtained, a power of a measurement signal that is supplied to the measurement antenna is corrected for a propagation loss error and a gain error that occur in association with rotation of the wireless terminal, angle correction for an angle error that occurs in association with the rotation of the wireless terminal is performed on the reception performance at each rotation angle, which is acquired with the measure signal having the corrected power, and thus the reception performance in a case where it is assumed that a terminal antenna of the wireless terminal is rotated at a position of a standard points is obtained.

20 Claims, 8 Drawing Sheets

(51) Int. Cl.
*H04B 17/29* (2015.01)
*G01R 29/08* (2006.01)

(58) Field of Classification Search
CPC ........ H04B 17/15; H04B 17/16; H04B 17/29; H04B 17/318; H04M 1/0202; H04M 1/24; H04M 1/67; H04M 3/22; G01R 29/0871; G01R 29/0892
USPC ................ 455/67.11, 226.1, 226.4, 423, 425
See application file for complete search history.

(56) References Cited

U.S. PATENT DOCUMENTS

| | | | | |
|---|---|---|---|---|
| 7,082,155 | B1* | 7/2006 | Ogami | H04B 7/01 455/226.2 |
| 8,971,821 | B2* | 3/2015 | Schlub | G01R 29/0857 455/67.12 |
| 9,264,278 | B2* | 2/2016 | Ji | H04L 27/266 |
| 10,104,560 | B2* | 10/2018 | Liu | G06F 3/03545 |

OTHER PUBLICATIONS

"Handbook for Electronics and Communication Engineers Antenna Engineering Handbook the fifth impression of the first edition: p. 1534, The Institute of Electronics, Information and Communication Engineers" Ohmsha, Ltd, Mar. 30, 1979.

* cited by examiner

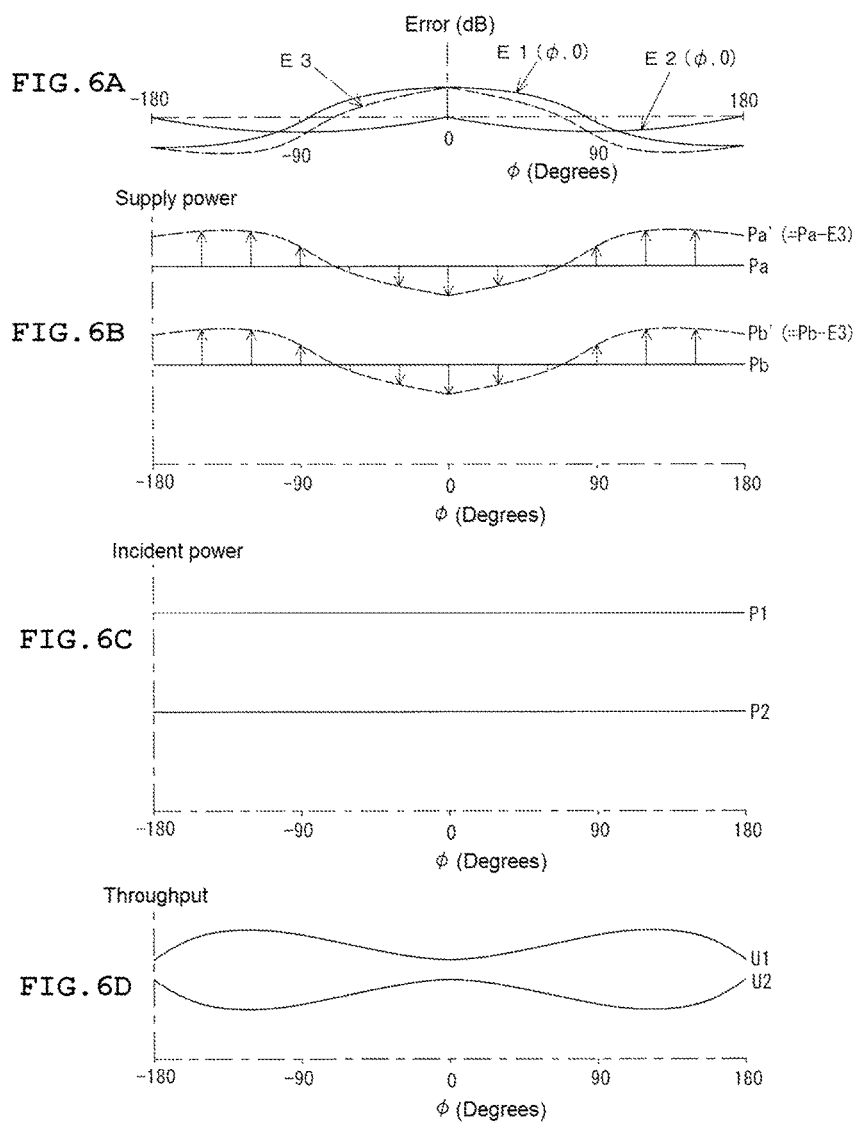

|  |  | $\theta 1$ | $\theta 2$ | ---- | $\theta n$ |
|---|---|---|---|---|---|
| A1 | $\phi 1$ | E0(1,1,1)<br>E1(1,1,1)<br>E2(1,1,1) | E0(1,2,1)<br>E1(1,2,1)<br>E2(1,2,1) | ---- | E0(1,n,1)<br>E1(1,n,1)<br>E2(1,n,1) |
|  | $\phi 2$ | E0(2,1,1)<br>E1(2,1,1)<br>E2(2,1,1) | E0(2,2,1)<br>E1(2,2,1)<br>E2(2,2,1) | ---- | E0(2,n,1)<br>E1(2,n,1)<br>E2(2,n,1) |
|  | --- | ---- | ---- | ---- | ---- |
|  | $\phi m$ | E0(m,1,1)<br>E1(m,1,1)<br>E2(m,1,1) | E0(m,2,1)<br>E1(m,2,1)<br>E2(m,2,1) | ---- | E0(m,n,1)<br>E1(m,n,1)<br>E2(m,n,1) |
| A2 |  | $\theta 1$ | $\theta 2$ | ---- | $\theta n$ |
|  | $\phi 1$ | E0(1,1,2)<br>E1(1,1,2)<br>E2(1,1,2) | E0(1,2,2)<br>E1(1,2,2)<br>E2(1,2,2) | ---- | E0(1,n,2)<br>E1(1,n,2)<br>E2(1,n,2) |
|  | $\phi 2$ | E0(2,1,2)<br>E1(2,1,2)<br>E2(2,1,2) | E0(2,2,2)<br>E1(2,2,2)<br>E2(2,2,2) | ---- | E0(2,n,2)<br>E1(2,n,2)<br>E2(2,n,2) |
|  | --- | ---- | ---- | ---- | ---- |
|  | $\phi m$ | E0(m,1,2)<br>E1(m,1,2)<br>E2(m,1,2) | E0(m,2,2)<br>E1(m,2,2)<br>E2(m,2,2) | ---- | E0(m,n,2)<br>E1(m,n,2)<br>E2(m,n,2) |

FIG. 9

| Inter-antenna distance (m) | Propagation loss (dB) in free space | | |
|---|---|---|---|
| | 800MHz | 2GHz | 28GHz |
| 0.5 | 24.5 | 32.4 | 55.4 |
| 1.0 | 30.5 | 38.5 | 61.4 |
| 3.0 | 40.0 | 48.0 | 70.9 |
| 5.0 | 44.5 | 52.4 | 75.4 |
| 10.0 | 50.5 | 58.5 | 81.4 |

FIG. 10

SYSTEM FOR MEASURING RECEPTION PERFORMANCE OF WIRELESS TERMINAL AND METHOD OF MEASUREMENT

TECHNICAL FIELD

The present invention relates to a technology for precisely measuring reception performance of a wireless terminal such as a mobile phone, a smartphone, a tablet computer, or a wireless router.

BACKGROUND ART

It is determined that, in contrast to a frequency (for example, 800 MHz, 20000 MHz, or the like) that is used for a wireless terminal which is called a third-generation or fourth-generation wireless terminal, a millimeter-wave band, for example, such as 24.25 GHz, 28 GHz, or 39 GHz, is allocated for a frequency that is used for a next-generation (fifth-generation wireless terminal), and a technology for measuring a perception performance of the wireless terminal that uses the millimeter-wave band is required.

Generally, for the reception of the wireless terminal, a measurement is made to check whether a normal throughput can be maintained according to a change in the intensity of an incident wave, and so forth, and there is also a need to investigate whether or not an influence, which results from a change in posturing of the wireless terminal, is exerted on the incident wave, needs to be as well.

In a case where the reception performance of the wireless terminal is measured in an environment close to an actual operating environment, there is a need to specify field intensity or magnitude of an incident power (hereinafter referred to as a radio wave intensity) at a position at which a radio wave that is emitted from a measurement antenna which is positioned, away from a terminal antenna of the wireless terminal, by a distance that satisfies a distance condition of far field measurement, enters an antenna of the wireless terminal. The distance condition of far field measurement is a state where a distance R between transmission and reception antenna satisfies the following condition.

$$R \geq 2D^2/\lambda$$

where $\lambda$ is a free space wave length (m) of a radio wave in use and D is the greater of the maximum diameters of openings of the transmission and reception antennas.

If D is set to be four times a wave length $\lambda$, $R \geq 2D^2/\lambda = 2(16\lambda^2)/\lambda = 32\lambda$. If a frequency of a radio wave is set to 30 GHz, $\lambda = 10$ mm and the distance R necessary for the remote-field measurement is 32 cm or more.

However, in order to make a measurement in such a manner that entrance of an unnecessary radio wave from the outside or unnecessary reflection of the measurement signal, or the like does not exert an influence, under an environment such as a radio free-field room, processing in which radio waves with predetermined intensities or different intensities, which are emitted from the measurement antenna, are provided to the terminal antenna of the wireless terminal located at the distance R between the wireless terminal and the measurement antenna and thus a predetermined performance is obtained needs to be performed while the wireless terminal is rotated by a terminal holding rotation mechanism centering around a phase center of the terminal antenna, for example in the horizontal direction and the vertical direction, and thus the reception performance in all directions needs to be obtained.

It is noted that the phase center of the antenna is a point which is virtually considered as a concentration point of a radio wave in the emission and incidence of the radio wave, and a position thereof depends on an antenna format. For example, in the case of a dipole antenna, a vicinity of a power supply point becomes a phase center, and in the case of a horn antenna, a phase center is positioned on a slightly inner side of a horn on a central line of a horn opening portion. In an ideal antenna, the center of the antenna is determined as a single point, but in a real antenna, such points are scattered due to various reasons. Here, an average position thereof is defined as an antenna phase center, and it is considered that the position scattering of the phase center of the antenna itself is enough small to be ignored compared with other errors in a measuring system. Furthermore, in the following description, "the position of the antenna" does not represent of a physical position of the antenna having a stereoscopic or planar extension, but represents a phase center that serves as an electric function of an antenna, unless otherwise mentioned.

It is noted that the distance condition of the far field measurement is described in Non-patent Documents 1 and 2, and others.

RELATED ART DOCUMENT

Non-Patent Document

[Non-Patent Document 1] "Antenna Engineering Handbook, the fifth impression of the first edition: pp. 439 to 446," The Institute of Electronics, Information and Communication Engineers: Ohmsha, Ltd, Dec. 30, 1989.

[Non-patent Document 2] "Antenna Engineering Handbook, the first impression of the first edition: pp. 1534," The Institute of Electronics, Information and Communication Engineers: Ohmsha, Ltd, Mar. 30, 1979

DISCLOSURE OF THE INVENTION

Problem that the Invention is to Solve

However, the terminal antenna of the wireless terminal in recent years, such as a mobile phone or a smartphone, has been provided within a terminal housing. In this regard, there is no problem as long as the wireless terminal is disposed so that the position of the terminal antenna (which, strictly speaking, is the phase center described above, which is similarly applied hereinafter) matches a rotation center of a terminal holding rotation mechanism for holding and rotating the wireless terminal. However, wireless terminals that are test targets have different appearances and sizes according to models, and there is no uniformity in positions of the terminal antenna provided therein.

Accordingly, in order to perform measurements of reception performances of these various wireless terminals, in each of which a terminal antenna is included, the wireless terminal has to be installed in such a manner that the position of the terminal antenna is the rotation center of the terminal holding rotation mechanism. For example, like a XYZ stage, a large-scale positioning mechanism that is extremely complicated and large-scaled is necessary. Moreover, an influence on the radio wave, which results from providing the positioning mechanism in the vicinity of the wireless terminal, is unavoidable.

As a method of solving this problem, a method for setting a distance R from a rotation center to the measurement antenna to be sufficiently long with respect to a distance from a rotation center of a terminal holding rotation mechanism to a terminal antenna and reducing the influence on measurement due to the position of the terminal antenna from the rotation center may be considered. For example, in a case where the distance R is set to several meters that are sufficiently long with respect to the distance (which, generally, is approximately several tens of millimeters to a maximum in the wireless terminal such as the smartphone), it is possible to greatly reduce the influence on the measurement due to the deviation of the position of the terminal antenna from the rotation center.

However, as shown in FIG. 10, compared with a 800 MHz band or a 2 GHz band, a propagation loss in a free space of millimeter-wave band (28 GHz) is noticeably large, and the distance R is set to several meters or longer as described above, the propagation loss become 70 dB or larger, which makes it difficult to perform measurement of a reception performance with high accuracy.

An object of the present invention is to provide a wireless terminal reception performance measurement system and measurement method capable of measuring an accurate reception performance without influence on measurement due to deviation of the position of a terminal antenna from a rotation center of a terminal holding rotation mechanism, even in a case where a distance between a wireless terminal that is a test target and a measurement antenna is a relatively short distance in which a far field measurement condition is satisfied and a propagation loss therebetween does not become large.

Unit for Solving the Problem

According to an aspect of the present invention, there is provided a wireless terminal reception performance measurement system, which includes a measurement antenna (21) having a known directional characteristic, which is fixed at a predetermined position in a measuring space in which entrance of a radio wave from outside and internal reflection of the radio wave are suppressed, a terminal holding rotation mechanism (30) that, within the measuring space, uses a point spaced from a phase center of the measurement antenna by a predetermined distance as a standard point, holds a wireless terminal (1) that is a measurement target, in a vicinity of the standard point, and rotates the held wireless terminal centering around the standard point within a region where a distance condition of far field measurement is satisfied from the measurement antenna, a transmission unit (40) that supplies a measurement signal to the measurement antenna; a response monitoring unit (45) that monitors a response to the measurement signal received through a terminal antenna by the wireless terminal which is held in the terminal holding rotation mechanism, and a reception performance acquisition unit (51) that rotates the wireless terminal from a standard position by controlling the terminal holding rotation mechanism and acquires a reception performance of the terminal holding rotation mechanism from a response attained at each rotation angle in the response monitoring unit and from a power of the measurement signal input to the terminal antenna of the wireless terminal; an antenna position input unit (52) through which a position of the terminal antenna in a case where the wireless terminal is disposed in the standard position in the measuring space, is input; an error information output unit (60 and 60') that outputs an angle error at each rotation angle of the wireless terminal, which indicates a deviation between a direction of the standard point and a direction of the terminal antenna, when viewed from the phase center of the measurement antenna, a propagation loss error in a free space at each rotation angle of the wireless terminal, which occurs due to a difference between a distance from the phase center of the measurement antenna to the standard point and a distance to the terminal antenna, and a gain error of the measurement antenna at each rotation angle of the wireless terminal, which is determined by the angle error and the directional characteristic of the measurement antenna, based on the input position of the terminal antenna; and a correction unit (70) that corrects a power of the measurement signal that is supplied from the transmission unit to the measurement antenna according to the propagation loss error and the gain error that are output from the error information output unit, when the reception performance acquisition unit obtains the reception performance of the wireless terminal, and along with this, corrects the reception performance for the rotation angle acquired by the measurement signal having the corrected power, with the angle error, and obtains the reception performance in a case where it is assumed that the terminal antenna is rotated at a position of the standard point.

Furthermore, in the wireless terminal reception performance measurement system, according to the aspect of the present invention, the error information output unit includes an angle error calculation unit (61) that calculates the angle error at each angle rotation of the wireless terminal, on the basis of the input position of the terminal antenna; a propagation loss error calculation unit (62) that calculates the propagation loss error in the free space at each rotation angle of the wireless terminal, on the basis of the input position of the terminal antenna; and a gain error calculation unit (63) that calculates the gain error of the measurement antenna at each rotation angle of the wireless terminal from the angle error at each rotation angle of the wireless terminal calculated by the angle error calculation unit, and from the directional characteristic of the measurement antenna.

Furthermore, in the wireless terminal reception performance measurement system according to the aspect of the present invention, the error information output unit includes an angle error storage unit (65) that stores, in a state where a plurality of candidate positions capable of becoming the position of the terminal antenna in a case where the wireless terminal that is the measurement target candidate is disposed at the standard position are set, in the measuring space, the angle error at each rotation angle of the wireless terminal, that is calculated in advance, with respect to each of the plurality of candidate positions, a propagation loss error storage unit (66) that stores the propagation loss error in the free space at each rotation angle of the wireless terminal, that is calculated in advance, with respect to each of the plurality of candidate positions, a gain error storage unit that stores the gain error of the measurement antenna at each rotation angle of the wireless terminal that is calculated in advance using the angle error stored in the angle error storage unit and the directional characteristic of the measurement antenna with respect to each of the plurality of candidate positions, and an error information read-out unit that reads out the angle error, the propagation loss error and the gain error at each rotation angle of the wireless terminal that are stored in advance in the angle error storage unit, the propagation loss error storage unit, and the gain error storage unit, with respect to a candidate position corresponding to the position input through the antenna position input unit, among the plurality of candidate positions, and assignees the errors that are read, to the correction unit.

Furthermore, in the wireless terminal reception performance measurement system according to the aspect of the present invention, the reception performance acquisition unit acquires a reception performance indicating a relationship between a power of the measurement signal that inputs to the terminal antenna, and a throughput that is attained from a response of the wireless terminal, which is monitored in the response monitoring unit, for the measurement signal at each rotation angle of the wireless terminal.

Furthermore, in the wireless terminal reception performance measurement system according to the aspect of the present invention, the reception performance acquisition unit acquires a reception performance indicating a relationship between a power of the measurement signal that inputs to the terminal antenna, and a throughput that is attained from a response of the wireless terminal, which is monitored in the response monitoring unit, for the measurement signal at each rotation angle of the wireless terminal.

Furthermore, in the wireless terminal reception performance measurement system according to the aspect of the present invention, the phase center is a point that is virtually considered as a concentration point of a radio wave in emission and incidence of the radio wave.

Furthermore, in the wireless terminal reception performance measurement system according to the aspect of the present invention, a frequency that is used for the wireless terminal is in a millimeter-wave band.

Furthermore, according to another aspect of the present invention, there is provided a method of measuring a reception performance of a wireless terminal, in which, in a measuring space in which entrance of a radio wave from outside and internal reflection of the radio wave are suppressed, a point spaced by a predetermined distance from a phase center of a measurement antenna (21) having a known directional characteristic, which is fixed at a predetermined position, is used as a standard point, in which a wireless terminal (1) that is a measurement target, which is held in a vicinity of the standard point, is rotated centering around the standard point within a region where a distance condition of far field measurement is satisfied from the measurement antenna in which a response that receives a measurement signal which is transmitted from the measurement antenna is monitored, through a terminal antenna by the wireless terminal, and in which a reception performance of the wireless terminal is acquired from the response and from a power of the measurement signal that inputs to the terminal antenna of the wireless terminal, the method including: a step of inputting a position of the terminal antenna in a case where the wireless terminal is disposed in the standard position in the measuring space; a step of outputting an angle error at each rotation angle of the wireless terminal, which indicates a deviation between a direction of the standard point and a direction of the terminal antenna, when viewed from the phase center of the measurement antenna, a propagation loss error in a free space at each rotation angle of the wireless terminal, which occurs due to a difference between a distance from the phase center of the measurement antenna to the standard point and a distance to the terminal antenna, and a gain error of the measurement antenna at each rotation angle of the wireless terminal, which is determined by the angle error and the directional characteristic of the measurement antenna; based on the input position of the terminal antenna; and a step of correcting a power of the measurement signal that is supplied to the measurement antenna according to the propagation loss error and the gain error, when the reception performance is acquired, and along with this, correcting the reception performance for the rotation angle acquired by the measurement signal having the corrected power, with the angle error, and obtaining the reception performance in a case where it is assumed that the terminal antenna is rotated at a position of the standard point.

Furthermore, in the method of measuring a reception performance of a wireless terminal, according to the aspect of the present invention, the step of outputting each of the errors is to calculate the angle error at each rotation angle of the wireless terminal, the propagation loss error, and the gain error, by computation using the input position of the terminal antenna.

Furthermore, the method of measuring a reception performance of a wireless terminal, according to the aspect of the present invention further includes: a step of setting a plurality of candidate positions capable of becoming the positions of the terminal antennas in a case where the wireless terminal that is the measurement target candidate target is disposed at the standard position, in the measuring space, calculating and storing in advance the angle error, the propagation loss error, and the gain error of the measurement antenna at each rotation angle of the wireless terminal, with respect to each of the plurality of candidate positions, in which the step of outputting each of the errors is to read out the angle error, the propagation loss error, and the gain error that are stored in advance, for a candidate position corresponding the input position of the terminal antenna, among the plurality of candidate positions.

Furthermore, in the method of measuring a reception performance of a wireless terminal, according to the aspect of the present invention, when the reception performance is acquired, a reception performance indicating a relationship between a power of the measurement signal that inputs to the terminal antenna, and a throughput that is attained from the monitored response of the wireless terminal is acquired at each rotation angle of the wireless terminal.

Advantage of the Invention

In this manner, in a wireless terminal reception performance measurement system according to the present invention, which is a measuring system in which a wireless terminal that is a measurement target is rotated centering around a standard point, and in which the reception performance of the wireless terminal in terms of a measurement signal that is output from a measurement antenna at each rotation angle of the wireless terminal is measured, when the reception performance is obtained, a power of the measurement signal that is supplied to the measurement antenna is corrected for a propagation loss error and a gain error that occur in association with rotation of the wireless terminal, and angle correction for an angle error that occurs in association with the rotation of the wireless terminal is performed on the reception performance at each rotation angle that is obtained with the measurement signal having the corrected power, and thus the reception performance in a case where it is assumed that the terminal antenna of the wireless terminal is rotated at the position of the standard point is obtained.

For this reason, even in a case where a distance between the wireless terminal that is a test target and a measurement antenna is a relatively short distance in which that a far field measurement condition is satisfied and a propagation loss does not become large, it is possible to accurately measure the reception performance without influence due to a deviation of a position of the terminal antenna from a rotation center.

BRIEF DESCRIPTION OF THE DRAWINGS

FIG. 6A to FIG. 6D are diagrams illustrating a principal part according to the present embodiment.

FIG. 9 is a diagram illustrating an example in which a principal part according to the embodiment of the present invention stores data.

FIG. 10 is a diagram illustrating an example of a free space propagation loss with respect to a frequency.

BEST MODE FOR CARRYING OUT THE INVENTION

An embodiment of the present invention will be described below with reference to the drawings.

Figure 1:
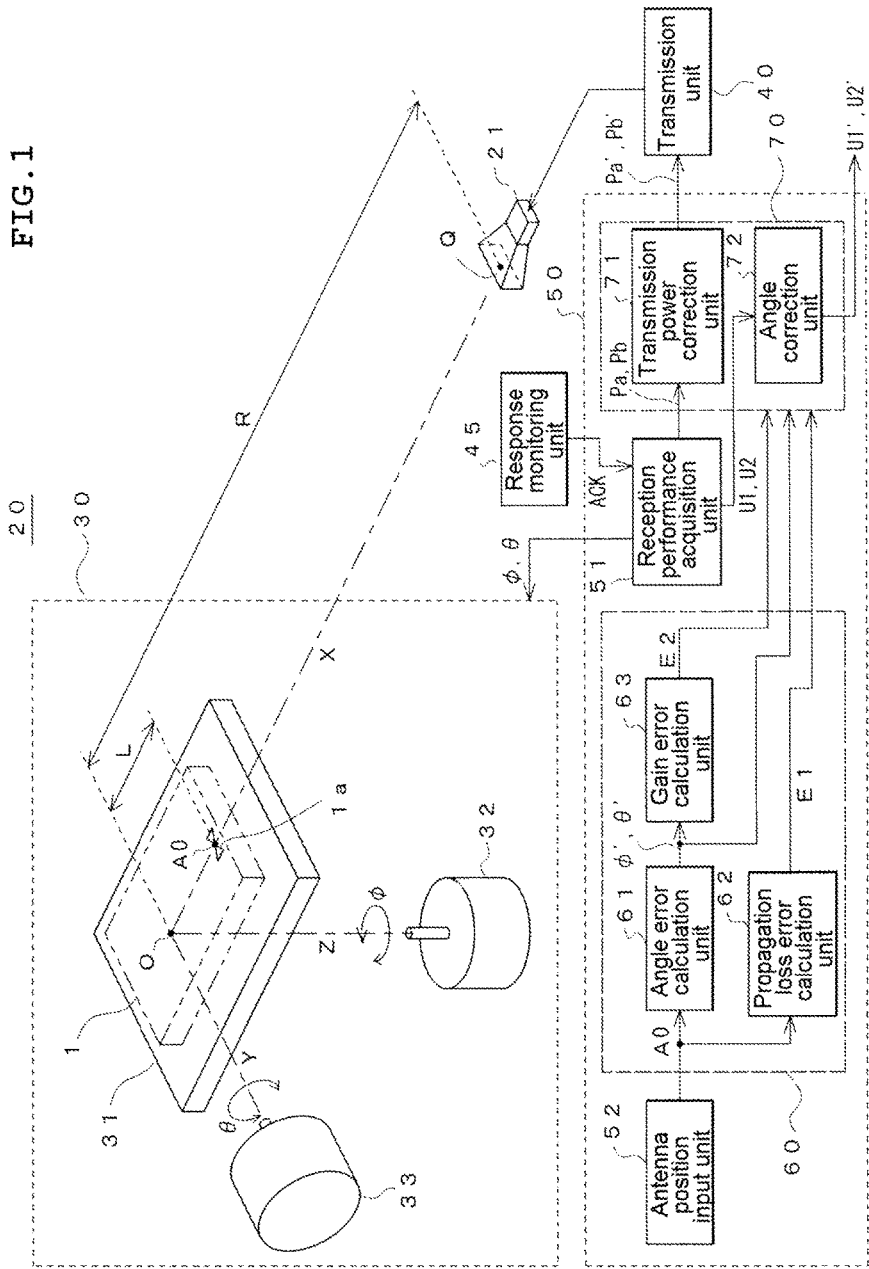
FIG. 1 is a diagram of an entire configuration according to an embodiment of the present invention.

FIG. 1 illustrates a configuration of a measuring system (hereinafter simply expressed as a measuring system) that measures a reception performance of a wireless terminal according to the embodiment of the present invention.

The measurement system 20 is configured with a measurement antenna 21, a terminal holding rotation mechanism 30, transmission unit 40, response monitoring unit 45, and a computational processing unit 50 of a computer configuration.

The measurement antenna 21 refers to an antenna having a known directional characteristic, which is fixed at a predetermined position in a measuring space (not shown) in which entrance of a radio wave from the outside and internal reflection are suppressed. The measurement antenna 21 outputs a measurement signal toward a wireless terminal 1 that is a measurement target which is similarly disposed in the measuring space. In a millimeter wave band, various antennas such as a horn antenna as shown in FIG. 1 or an antenna (for example, a tapered slot antenna) in which an antenna element is patterned on a printed board may be used.

The terminal holding rotation mechanism 30 holds, using a point spaced from a phase center Q of the measurement antenna 21 by a predetermined distance R in a standard direction (which is normally a maximum gain direction perpendicular to an opening) of a directional characteristic as a standard point O, and the wireless terminal 1 that is the measurement target in the vicinity of standard point O, and rotates the held wireless terminal 1 centering around the standard point O within an region where a distance condition of far field measurement is satisfied from the measurement antenna 21, in the measuring space.

In the embodiment, it is assumed that the measuring space is represented by an XYZ orthogonal coordinate system using the standard point O as the original, and it is assumed that the phase center Q of the measurement antenna 21 is disposed on an X-axis, a Z-axis represents a vertical direction in FIG. 1, and a Y-axis represents a direction orthogonal to the X-axis and the Z-axis. The terminal holding rotation mechanism 30 has a structure in which the held wireless terminal is rotated centering around the standard point, around at least the Z-axis and the Y-axis among the three orthogonal axes X, Y, and Z. It is noted that a three-axis structure in which rotation around the X-axis also takes place can be used.

As described above, at this point, the measuring space is represented by the XYZ orthogonal coordinate system using the standard point O as the origin, but an origin position of a coordinate system for defining the measuring space is arbitrary. For example, the phase center Q of the measurement antenna 21 may or the like may be used as the origin instead of the standard point O. Alternatively, instead of the orthogonal coordinate system and a polar coordinate system in which the standard point O, the phase center Q of the measurement antenna 21, or the like is used as the origin may be used.

A specific mechanism of the terminal holding rotation mechanism 30 is not described in detail, but for example, as shown in FIG. 1, any arbitrary structure for rotating a holding stand 31 that holds the wireless terminal 1 around the Z-axis and the Y-axis using rotation devices 32 and 33 such as stepping motors or servo motors, to rotate, centering around the standard point O at a predetermined-angle step may be used. Control of these rotation angles is controlled by the computational processing unit 50. As a material and a shape of the holding stand 31, a material and a shape that less affect reception performance of a terminal antenna 1a of the wireless terminal 1 including a holding mechanism are used.

The transmission unit 40 is one that supplies the measurement signal necessary for measurement of the reception performance to the measurement antenna 21 for transmission to the wireless terminal 1, and has a function of being able to make variable a power of the measurement signal that is supplied to the measurement antenna 21.

Generally, at this point, as the reception performance of the wireless terminal that is desired to be measured, there are a performance indicating a relationship between an incident power (or an interfering wave) of a desired wave and a throughput, and the like. In order to quantitatively obtain the throughput, a function of successively transmitting data to the wireless terminal 1 and of replying to a transmission source with a positive acknowledgement message (ACK message) indicating that the wireless terminal 1 acknowledges that the data is received is used. The throughput is one that indicates a ratio of the number of replies with the positive acknowledgement messages to an amount of transmitted data. In a case where the reception performance relating to the throughput, a response to the measurement signal (data) is the positive acknowledgement message, and the response monitoring unit 45 detects the positive acknowledgement message. It is noted that intensity of the radio wave will be described below as being indicated by a power, but that field intensity may be used to indicate the intensity of the radio wave.

The response monitoring unit 45 is one that monitors a response to the measurement signal that is transmitted to the wireless terminal 1 in order to obtain a desired reception performance. As described above, if the reception performance is one that indicates the relationship between the incident power of each of the measurement signals (which, in some cases, include not only a desired wave but also an interfering wave) for the wireless terminal 1 and the throughput, the response monitoring unit 45 monitors the positive acknowledgement message that is output by the wireless terminal 1. In such a case, the response monitoring unit 45 can be configured to have a function of a wireless reception apparatus that receives the radio wave which is output from the wireless terminal 1 and demodulates the positive acknowledgement message and the like, and, along with the transmission unit 40, can use a reception and transmission function of a base station apparatus that performs communication with the wireless terminal.

Furthermore, the response monitoring unit 45 is one that, as a type other than the type of wireless reception apparatus, can make a connection to a communication connector of the wireless terminal 1 through a cable, and can monitor the positive acknowledgement message, a message necessary for measurement of other reception performances, or the like.

The computational processing unit 50 executes a variety of controls and computational processing necessary for the measurement system 20, but herein, by control of the terminal holding rotation mechanism 30 described above, performs processing that requires a reception performance at each rotation angle of the wireless terminal 1, and calculation processing and error correction processing of various errors of a measurement system due to a change in a position of a terminal antenna that accompanies rotation of the wireless terminal 1, which are necessary when acquiring the reception performance. The computational processing unit 50 is configured by software by executing a predetermined program with respect to the respective processes.

A reception performance acquisition unit 51 of the computational processing unit 50 rotates the wireless terminal 1 from a standard position by controlling the terminal holding rotation mechanism 30 and thus. Along with this, the reception performance acquisition unit 51 allocates the power of the measurement signal that is output by the transmission unit 40 to the measurement antenna 21 and receives a response of the wireless terminal 1 to the measurement signal from the response monitoring unit 45, and thus acquires a desired reception performance (which is actually a temporary reception performance in which an angle error, as will be described, is included).

Figure 2:
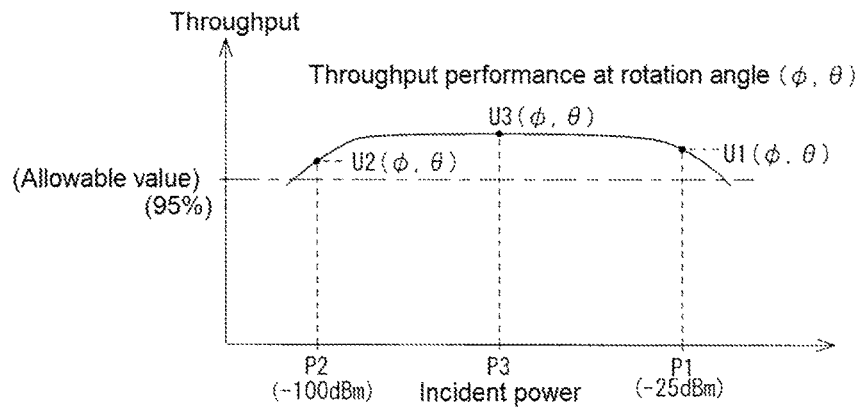
FIG. 2 is a diagram for describing a reception performance according to the embodiment.

At this point, for example, when a rotation angle of the wireless terminal 1 is ($\phi$, $\theta$), the detail of the reception performance, as shown in FIG. 2, is set to result from obtaining each of the throughputs $U1(\phi, \theta)$ and $U2(\phi, \theta)$ for an upper limit value P1 (for example, −25 dBm) and a lower limit value P2 (for example, −100 dBm), respectively, of the incident power of the desired wave (for example, in some cases, a throughput of at least one incident power, which has a value between P1 and P2 other than P1 and P2, for example, a throughput U3 for an incident power P3 is obtained).

As described above, values $U1(\phi, \theta)$ and $U2(\phi, \theta)$ of throughputs of normal incident powers P1 and P2, respectively, are set to be performance values, but in the following description, conversely, the upper limit value $P1(\phi, \theta)$, the upper value $P1(\phi, \theta)$ and the lower limit value $P2(\phi, \theta)$ of the incident power of which a throughput is an allowable value (for example, 95%) or above may be set to be performance values. Furthermore, a result of comparison between the value of the throughput of the normal incident power and the allowable value, or results of comparison between the upper limit value $P1(\phi, \theta)$ and the lower value $P2(\phi, \theta)$ of the incident power of which the throughput is the allowable value or above, and an allowable power value Pr1 and an allowable power value Pr2, respectively.

When it is assumed that a position of the terminal antenna 1$a$ of the wireless terminal 1 is at the standard point O, a condition for causing a measurement signal having a normal power P1 to input to the terminal antenna 1$a$ may be that, when a gain (which is also set to include connection loss between the wireless terminal 1 itself and the transmission unit 40) in a direction of the standard point O for the measurement antenna 21 is set to be Gr(dB) and when propagation loss in a free space due to the distance R from the measurement antenna 21 to the standard point O is set to be Lr (dB), the transmission unit 40 supplies a measurement signal having a power of Pa=P1−Gr+Lr to the measurement antenna 21. Furthermore, in order to cause a measurement signal having a normal power P2 to input to the terminal antenna 1$a$, the measurement signal having a power of Pb=P2−Gr+Lr may be supplied.

Therefore, when acquiring the reception performance described above, the reception performance acquisition unit 51 performs processing that makes a calculation of each of $U1(\phi, \theta)$ and $U2(\phi, \theta)$, each time the rotation angle ($\phi$, $\theta$) of the wireless terminal 1 is caused to change, while causing the power of the measurement signal, which is allocated to the transmission unit 40, to switch between Pa and Pb.

A specific rotation control with respect to the terminal holding rotation mechanism 30 is performed by receiving a measurement starting instruction through an operating unit (not shown) or the like by the reception performance acquisition unit 51 and rotating the held wireless terminal 1 in the holding stand 31 of the terminal holding rotation mechanism 30 around the Z-axis and the Y-axis centering around the standard point O from the standard position (standard posture), by predetermined steps $\Delta\phi$ and $\Delta\theta$, respectively. Furthermore, herein, with respect to the rotation angle $\phi$ around the Z-axis, the rotation is by the step $\Delta\phi$ in a range of 0° to 360° (0°±180°), and with respect to the rotation angle $\theta$ around the Y-axis, the rotation is performed by the $\Delta\theta$ in a range of 0° to 180° (0°±90°). Thus, all directions are covered centering around the standard point O. The operating unit is used for performing an operation input from a user, and includes an input device such as a keyboard, a touch panel, or a mouse.

The order of the rotation controls is arbitrary, but for example, an operation of changing one by one step and then changing the other rotation angle, a predetermined number of step, for example, by 360° (or ±180°) is repeated. In a case where one step is set to $\Delta\phi=\Delta\theta=5°$, the positions of the terminal antenna 1$a$ are 2522 places obtained by adding two upper and lower polar points, to a product of 360/5=72 points around the Z-axis and a 180/5−1=35 points obtained by excluding $\theta=\pm90°$ (two upper and lower polar points) points around the Y-axis.

Further, herein, as shown in FIG. 1, in order to apply a coordinate conversion formula (which will be described later), a state where a terminal holding surface of an holding stand 31 is held to be in parallel to a XY plane, a display operating surface of the wireless terminal 1 on the accompanying holding stand 31 is held to be in an approximately horizontal state (sleeping state), on the terminal holding surface and the terminal antenna 1$a$ in the wireless terminal 1 is disposed on the X-axis and is disposed at a position closest to the measurement antenna 21 is set as the standard position. In this case the standard point O is disposed on a line that passes through a position higher than the terminal holding surface of the holding stand 31, and is disposed in the wireless terminal, in many cases. In a case where a state where the position of the terminal antenna 1$a$ is disposed at a position higher than the X-axis (or a position lower than the X-axis) is set as the standard position, by performing offset correction the rotation angle $\theta$ around around the Y-axis at an angle associated with a deviation in the height direction, it is possible to the coordinate conversion formula (which will be described later). Further, the standard position of the wireless terminal 1 is set to specifying the posture of the wireless terminal 1 in starting the measurement and is not limited to the above-described position. Instead of the state where the display operation surface of the wireless terminal 1 is parallel to the XY plane (sleeping state), a state where the display operating surface of the wireless terminal 1 is parallel to a YZ plane (standing state) or a state where the display operating surface of the wireless terminal in parallel to a XZ plane may be set as the standard position (the standard posture).

At this point, as described above, in an ideal state where the position of the terminal antenna 1a is disposed at the standard point O, the reception performance of the wireless terminal including the terminal antenna 1a in such a state can be precisely acquired, but in reality, since the position of the terminal antenna 1a is not present at the standard point O and an error occurs. Thus, as units for preventing this error, an antenna position input unit 52, an error information output unit 60, and correction unit 70 are provided to the computational processing unit 50.

The antenna position input unit 52 is used for inputting coordinates for specifying the position of the terminal antenna 1a in a case where the wireless terminal 1 is disposed in the standard position in the measurement space represented by the XYZ orthogonal coordinate system using the standard point O as the origin. For example, coordinates (hereinafter expressed as initial coordinates) through the antenna position input unit 52, a tester inputs A0=(X, Y, Z) of the terminal antenna 1a in a case where the wireless terminal 1 is held at the standard position are input from a tester using an operation unit (not shown) or the like. As described above, in a case where the state where the terminal holding surface of the holding stand 31 is parallel to the XY plane and where the terminal antenna 1a in the wireless terminal 1 held in the approximately horizontal state on the terminal holding surface is disposed on the X-axis and is disposed at the position closest to the measurement antenna 21 is set as the standard position, initial coordinates A0 of the terminal antenna 1a become (L, 0, 0). Here, L represents a distance (that is equal to a rotation radius) from the standard point O to the terminal antenna 1a. The antenna position input unit 52 is used for performing an operation input from a user, and includes an input device such as a keyboard, a touch panel, or a mouse.

The error information output unit 60 outputs information on each error at each rotation angle of the wireless terminal 1, which occurs in a case where the position of the terminal antenna 1a is not present at the standard point O, on the basis of the position of the terminal antenna 1a input through the antenna position input unit 52. In this embodiment, the error information output unit 60 includes three error calculation units that calculates errors through computation using the input position of the terminal antenna 1a, that is, angle error calculation unit 61, propagation loss error calculation unit 62, and gain error calculation unit 63. The angle error calculation unit 61, the propagation loss error calculation unit 62, and the gain error calculation unit 63 are configured in a software form by executing a predetermined program with respect to respective processes thereof.

The angle error calculation unit 61 calculates an angle error ($\phi'$, $\theta'$) indicating a deviation of a direction of the terminal antenna 1a seen from the phase center Q of the measurement antenna 21 with respect to a direction of the standard point O seen from the phase center Q of the measurement antenna 21, on the basis of the input initial coordinates A0 of input terminal antenna 1a, at each rotation angle ($\phi$, $\theta$) in the Z-axis and the Y-axis.

Figure 3:
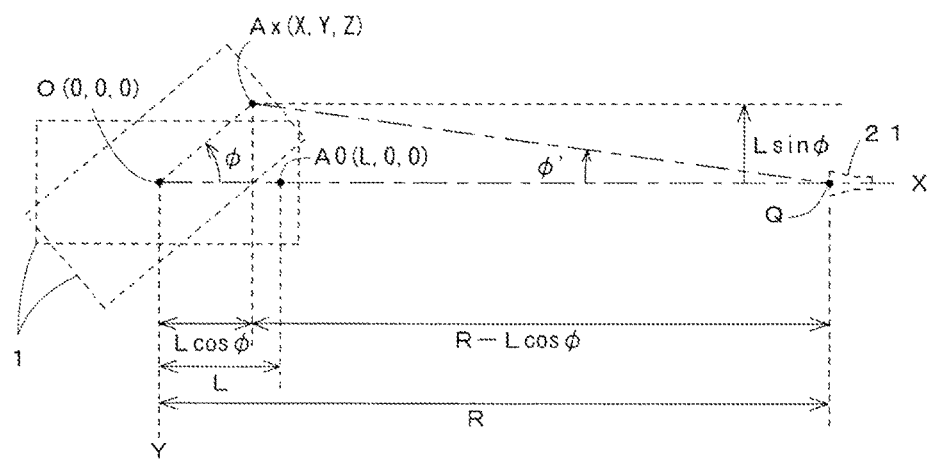
FIG. 3 is a diagram for describing an angle error.

For example, as shown in a simple example in FIG. 3, in a case where the terminal antenna 1a is rotated by the angle $\phi$ around the Z-axis from the initial coordinates A0 on the X-axis spaced by the distance L from the standard point O, an angle from coordinates Ax of the terminal antenna 1a after rotation toward the phase center of the measurement antenna 21 becomes an angle of $\phi+\phi'$ obtained by adding $\phi'=\tan^{-1}[L \sin \phi/(R-L \cos \phi)]$ to the rotation angle of $\phi$, which is an angle that deviates by $\phi'$ with respect to the direction of the standard point O seen from the measurement antenna 21.

Similarly, in a case where the terminal antenna 1a is rotated by the angle $\theta$ around the Y-axis, a real direction toward the measurement antenna 21 becomes an angle $\theta+\theta'$ obtained by adding an error angle $\theta'$ to the rotation angle $\theta$.

In a case where the input initial coordinates A0=(X, Y, Z) of the terminal antenna 1a are determined, the error angles $\theta'$ and $\phi'$ for the rotation angles $\theta$ and $\phi$ are uniquely calculated using the following coordinate conversion processing.

$$\begin{pmatrix} X(\phi, \theta, \psi) \\ Y(\phi, \theta, \psi) \\ Z(\phi, \theta, \psi) \end{pmatrix} = \begin{pmatrix} \cos\phi\cos\theta & \begin{matrix}\cos\phi\sin\theta\sin\psi - \\ \sin\phi\cos\psi\end{matrix} & \begin{matrix}-\cos\phi\sin\theta\cos\psi - \\ \sin\phi\sin\psi\end{matrix} \\ \sin\phi\cos\theta & \begin{matrix}\sin\phi\sin\theta\sin\psi + \\ \cos\phi\cos\psi\end{matrix} & \begin{matrix}-\sin\phi\sin\theta\cos\psi + \\ \cos\phi\sin\psi\end{matrix} \\ \sin\theta & -\cos\theta\sin\psi & \cos\theta\cos\psi \end{pmatrix}\begin{pmatrix} X \\ Y \\ Z \end{pmatrix}$$

[Expression 1]

The coordinate conversion formula also includes a rotation angle $\psi$ around the X-axis, but as in this embodiment, in a case where the rotation is performed around only Z-axis and the Y-axis, the following coordinate conversion processing may be used using $\psi=0$.

$$\begin{pmatrix} X(\phi, \theta) \\ Y(\phi, \theta) \\ Z(\phi, \theta) \end{pmatrix} = \begin{pmatrix} \cos\phi\cos\theta & -\sin\phi & -\cos\phi\sin\theta \\ \sin\phi\cos\theta & \cos\phi & -\sin\phi\sin\theta \\ \sin\theta & 0 & \cos\theta \end{pmatrix}\begin{pmatrix} X \\ Y \\ Z \end{pmatrix}$$

[Expression 2]

Figure 4:
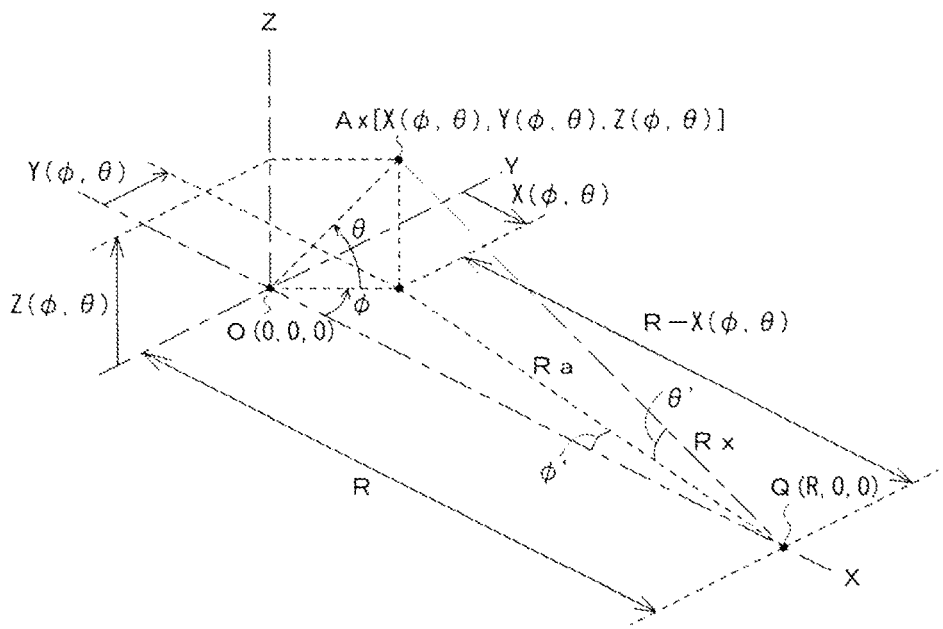
FIG. 4 is a diagram for describing a propagation loss error and an angle error.

For example, as shown in FIG. 4, the angle errors $\theta'$ and $\phi'$ calculated by the angle error calculation unit 61 in a case where the position of the terminal antenna 1a is rotates by the angle $\phi$ around the Z-axis and the angle $\theta$ around the Y-axis from the standard position are as follows.

$\theta'=\tan^{-1}[Z(\phi,\theta)/Ra]$ $\phi'=\tan^{-1}\{Y(\phi,\theta)/[R-X(\phi,\theta)]\}$ Here, $Ra=\{Y(\phi, \theta)^2+[R-X(\phi, \theta)]^2\}^{1/2}$.

The process is performed to calculate an angle deviation of the direction toward the measurement antenna 21, which accompanies an orbiting movement of the radius L centering around the standard point O of the terminal antenna 1a. In this regard, in association with the orbiting movement of the terminal antenna 1a, it is natural that the distance to the measurement antenna 21 also changed, and thus, an error occurs in a free space propagation loss due to the distance change with respect to an ideal state in which the terminal antenna 1a is rotated at the position of the standard point O.

The propagation loss error calculation unit 62 calculates a distance Rx from the terminal antenna 1a to the phase center Q of the measurement antenna 21 at each rotation angle of the wireless terminal 1, and calculates a propagation loss error in a free space that occurs due to a difference between the distance Rx and a distance R from the phase center Q of the measurement antenna 21 to the standard point O.

For example, as shown in FIG. 4, the distance Rx between the antennas in a case where the position of the terminal antenna 1a is rotated by the angle $\phi$ around the Z-axis and by the angle $\theta$ around the Y-axis from the initial coordinates is expressed as Rx=$[Z(\phi, \theta)^2+Ra^2]^{1/2}$ using the above-described coordinate conversion result.

Therefore, in contrast with propagation loss Lr in the free space that corresponds to the distance R from the measurement antenna 21 to the standard point O, a propagation loss error E1 ($\phi$, $\theta$) that occurs due to the rotation can be calculated with E1($\phi$, $\theta$)=20 log(R/Rx) [dB].

Further, the gain error calculation unit 63 obtains a gain error E2($\phi$, $\theta$) from a maximum gain determined by a deviation angle of the direction toward the measurement antenna 21, which accompanies the orbiting movement of the terminal antenna 1a.

Figure 5:
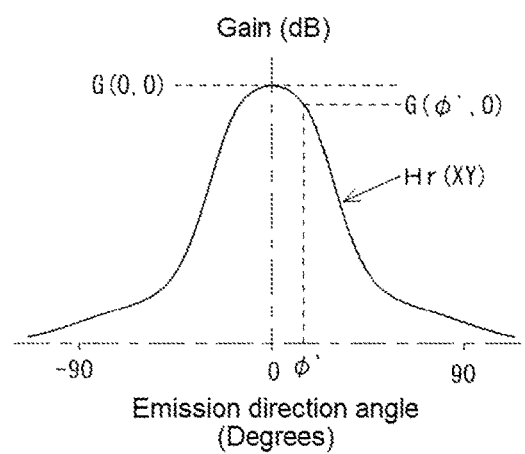
FIG. 5 is a diagram for describing a gain error of a measurement antenna, which accompanies the angle error.

In a case where a directional characteristic of $\theta$=0 on the XY plane of the measurement antenna 21 is shown as in Hr(XY) in FIG. 5, the gain error E2 ($\phi$, $\theta$) may be calculated by a difference between a gain (generally, a maximum gain) G (0, 0) with respect to a radio wave that comes along the X-axis in the case of the ideal state and a gain G ($\phi'$, 0) with respect to a radio wave that actually emitted comes at the deviation angle of $\phi'$ with respect to the X-axis. In a case where the rotation angle is extended to two axes, the gain error E2($\phi$, $\theta$) in the case of the deviation angle $\phi'$ around the Z-axis and the deviation angle $\theta'$ around the Y-axis may be calculated by computation of E2($\phi$, $\theta$)=G($\phi'$, $\theta'$)–G (0, 0), using a gain G ($\phi'$, $\theta'$) of the measurement antenna in the case of incidence angles are $\phi'$ and $\theta'$.

The correction unit 70 has transmission power correction unit 71 and angle correction unit 72, and performs correction using each error that is attained in the error information output unit 60.

When the reception performance acquisition unit 51 acquires the reception performance of the wireless terminal 1, the transmission power correction unit 71 performs correction Pa'=Pa–E3($\phi$, $\theta$) and Pb'=Pb–E3 ($\phi$, $\theta$) on supply powers Pa and Pb, respectively, of measurement signals, which are allocated to the transmission unit 40, and sets measurement signals having the supply powers Pa' and Pb', respectively, that result from the correction, to be assigned from the transmission unit 40 to the measurement antenna 21. However, E3($\phi$, $\theta$) is an error in a gain direction and is equal to E1 ($\phi$, $\theta$)+E2($\phi$, $\theta$).

Furthermore, in a state where the measurement signals that have the supply power Pa' and Pb', respectively, are assigned from the transmission unit 40 to the measurement antenna 21, the angle information correction unit 72 performs correction for the angle error on a performance (a temporary performance) at each rotation angle, which is acquired by the reception performance acquisition unit 51, and obtains a reception performance in a case where it is assumed that the terminal antenna 1a is rotated centering around the standard point O at the position of the standard point O.

More precisely, errors E1 ($\phi$, $\theta$) and E2($\phi$, $\theta$) in the gain direction, which occurs when acquiring the reception performance are canceled by correction E3($\phi$, $\theta$)=E1 ($\phi$, $\theta$)+E2 ($\phi$, $\theta$) on power values Pa and Pb, respectively, that are allocated, and normal incident-power values P1 and P2 are assigned to the terminal antenna 1a of the wireless terminal 1 regardless of the rotation angle. Thus, throughputs U1($\phi$, $\theta$) and U2($\phi$, $\theta$) at each rotation angle of $\phi$, $\theta$ are attained as temporary reception performances.

Because a direction of the measurement antenna 21, when viewed from the terminal antenna 1a, is ($\phi$+$\phi'$, $\theta$+$\theta'$), correction in which angles $\phi$ and $\theta$ for the temporary reception performance is replaced with ($\phi$+$\phi'$, $\theta$+$\theta'$) that is a direction of the measurement antenna 21 when viewed from the terminal antenna 1a is performed on the temporary performance that results from the correction in the gain direction. Thus, a reception performance that results from also performing correction correctly in the angle direction can be obtained. The correction in the angle direction is performed on the temporary reception performance at each rotation angle, and thus the reception performance that results when it is assumed that the terminal antenna 1a rotates at the position of the standard point O can be precisely obtained.

For example, when rotation is caused to take place at $\theta$=0 in the range of $\phi$=0°±180°, as shown in FIG. 6A, the propagation loss error E1($\phi$, 0) has a positive maximum value at $\phi$=0° and a negative minimum value at $\phi$±180°, the gain error E2($\phi$, 0) has a negative minimum value of 0 and negative minimum values in the range of 0 to ±90° at $\phi$=0° and $\phi$=180°, respectively. An error performance in the gain direction, which results from adding these, is as is indicated by E3.

Then, when acquiring the reception performance, as shown in FIG. 6B, the power values Pa and Pb that are allocated from reception performance allocation unit 51 to the transmission unit 40 are fixed with respect to the rotation angle, but are Pa' ($\phi$, 0) and Pb' ($\phi$, 0) that result from performing correction at rotation angles, respectively, using a performance for the error E3. Each of the power values Pa' ($\phi$, 0) and Pb' ($\phi$, 0) that result from this correction is the transmission unit 40, and measurement signals that have powers Pa' ($\phi$, 0) and Pb' ($\phi$, 0), respectively, are output from the measurement antenna 21 in the direction of the standard point O.

The measurement signal inputs to the terminal antenna 1a that is positioned at a distance away from the standard point O, with the error E3 in the gain direction. Because of this, the error E3 and a power correction portion of the measurement signal cancel each other, and as shown in FIG. 6C, the normal incident-power values P1 and P2 are allocated to the terminal antenna 1a regardless of the rotation angle.

In this manner, in a state where the normal incident powers P1 and P2 are assigned regardless of the rotation angle, the throughputs U1($\phi$, 0) and U2($\phi$, 0) are obtained from a response by the wireless terminal 1, and for example, the temporary reception performance as shown in FIG. 6D, is attained. It is noted that changes in the throughputs U1($\phi$, 0) and U2($\phi$, 0) are due to a change in a gain or the like that accompanies the rotation of the terminal antenna 1a.

Figures 7A, 7B:
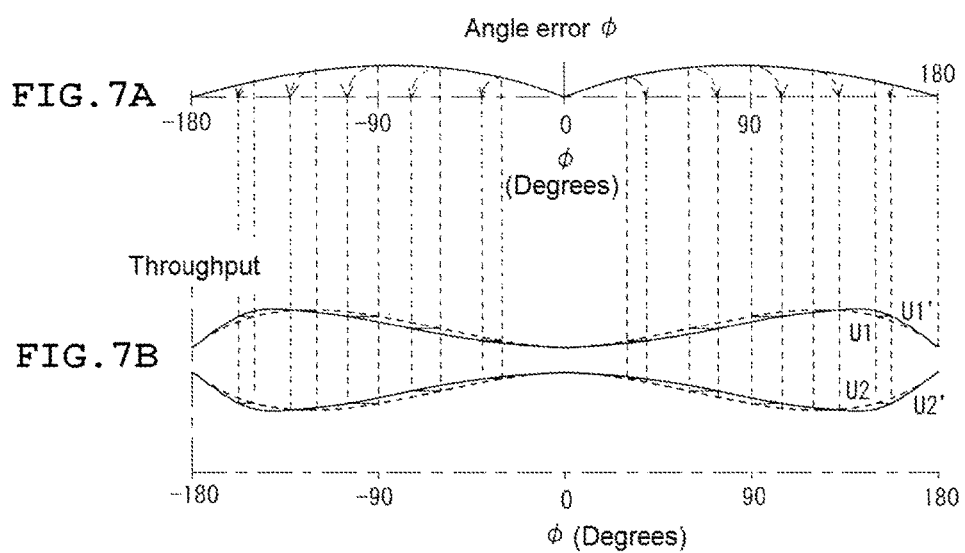
FIG. 7A and FIG. 7B are diagrams illustrating a principal part according to the present embodiment.

Furthermore, an angle error $\phi'$, as shown in FIG. 7A, has a positive maximum value of 0 and a positive maximum value in the range of 0 to ±90° at $\phi$=0° and ±180°, respectively and due to the angle error $\phi'$, there is a need to perform correction of angles for the throughputs U1($\phi$, 0) and U2($\phi$, 0).

More precisely, as shown in FIG. 7B, when the correction of the throughputs U1($\phi$, 0) and U2($\phi$, 0) that are indicated by a dotted line, which are attained at the rotation angle $\phi$ of the wireless terminal 1 is performed regardless of a position at the angle of $\phi$+$\phi'$, throughputs for each angle $\phi$ have performances U1'($\phi$, 0) and U2'($\phi$, 0), respectively, which are indicated by a solid line and which are shifted to a position at the angle of φ+φ'. This performance is a desired reception performance that results when it is assumed that the terminal antenna 1a rotates about the Z-axis in the range of ±180° at the position of the standard point O, and based on this, evaluation of the wireless terminal 1 can be correctly made.

An example will be described below where a value of a throughout of the normal incident power is obtained, but as described above, even in a case where the upper limit value P1(φ, θ) and the lower limit value P2(φ, θ) of the incident power of which the throughput is the allowable value (for example, 95%) or above are set to be the performance values, for example, this setting can be dealt with by correcting the upper limit value P1(φ, 0) and the lower limit value P2(φ, 0) that are obtained by the rotation angle (φ, 0) is performed regardless of the position of the angle of φ+φ' in the same as described above.

Furthermore, in a case where a result of comparison between each of the values U1(φ, θ) and U2(φ, θ) the throughput of the normal incident power and the allowable value (for example, 95%) to determine which one is greater than the other, or a result of comparison between the upper limit value P1(φ, θ) and the lower limit value P2(φ, θ) of the incident value of which the throughput is the allowable value (for example, 95%) and the allowable power value Pr1 and the allowable power value Pr2, respectively to determine which one is greater than the other is obtained as the temporary reception performance, this can be dealt with by performing correction (angle replacement) in which a result H(φ, θ) of the comparison is simply set to be (φ+φ', θ+θ') that is an angle position.

It is noted that, in a case where, as described above, the angle correction is performed, the rotation angle of the wireless terminal 1 can be caused to change in an easy-to-divide manner by equal distances such as one-degree steps, two-degree steps, and five-degree steps, but as described above, an angle position of a performance value of the reception performance that results from angle correction does not neither necessarily have an easy-to-divide value due to addition of the angel error, but a distance (an acquisition distance) between each of the post-correction performance values on a plot line has to be fixed. Therefore, for example, this causes inconvenience in a case where comparison is made between performance values for easy-to-divide angles.

As a method for solving this, a method of setting the angle of φ, θ at which the wireless terminal 1 rotates is set in advance in such a manner that an angle (φ+φ', θ+θ'), for example, changes by an easy-to-divide distance (one degree, 2 degrees, 3.6 degrees, 4 degrees, 5 degrees, 6 degrees, or the like) such as when 360 degrees is equally divided by an integer (for example, 360, 180, 100, 90, 72, 60, or the like). In this case, if correction in which a performance value of the temporary performance at the position that is present at the rotation angle of φ, θ depends on (or is replaced with) a position that is at φ+φ', θ+θ' is performed, a position for the performance value of the final reception performance can be set in an easy-to-divide manner at an equal distance, and comparison between performance values for easy-to-divide angles or the like can be made.

In this manner, in a measurement system 20 according to the present embodiment, which is a measuring system in which a wireless terminal 1 that is a measurement target is caused to rotate with a standard point O in the center and in which a reception performance of the wireless terminal 1 in terms of a measurement signal that is output from a measurement antenna 21 at each rotation angle of the wireless terminal 1 is measured, when the reception performance is obtained, a power of the measurement signal that is supplied to the measurement antenna 21 is corrected for a propagation loss error and a gain error that occur in association with rotation of the wireless terminal 1 and angle correction for an angle error that occurs in association with the rotation of the wireless terminal 1 is performed on a temporary performance that is obtained in terms of a measurement signal having the corrected power, and thus a reception performance is calculated in a case where it is assumed that the terminal antenna 1a of the wireless terminal 1 is rotated at the position of the standard point O.

Thus, even in a case where a distance between the wireless terminal 1 that is a test target and a measurement antenna 21 is a relatively short distance in which a far field measurement condition is satisfied and a propagation loss therebetween does not become large, it is possible to accurately measure a reception performance without influence on measurement due to deviation of the position of the terminal antenna 1a from a rotation center.

In the above-described embodiment, in a measuring space, an angle error at each rotation angle, a propagation loss error, and a gain error at each rotation angle are calculated through computational processing using an input values of coordinates for specifying the position of the terminal antenna 1a, and a reception performance is corrected using these errors, that results when it is assumed that the terminal antenna 1a of the wireless terminal 1 is caused to rotate at the position of the standard point O. However, in the measurement space, a plurality of candidate positions capable of becoming the position of the terminal antenna in a case where the wireless terminal that is the measurement target candidate is disposed at the standard position are set, the angle error, the propagation loss error, and the gain error, which are described above, for each of the plurality of candidate positions, are be calculated at each rotation angle of the wireless terminal and are stored in advance, and in a case where the position of a terminal antenna of a wireless terminal that is an real measurement target is input, the angle error, the propagation loss error, and the gain error that are stored in advance with respect to a candidate position corresponding to the input position are read out; and, using this, a reception performance that results when it is assumed that the terminal antenna 1a of the wireless terminal 1 is caused to rotate at the position of the standard point O may be calculated.

Figure 8:
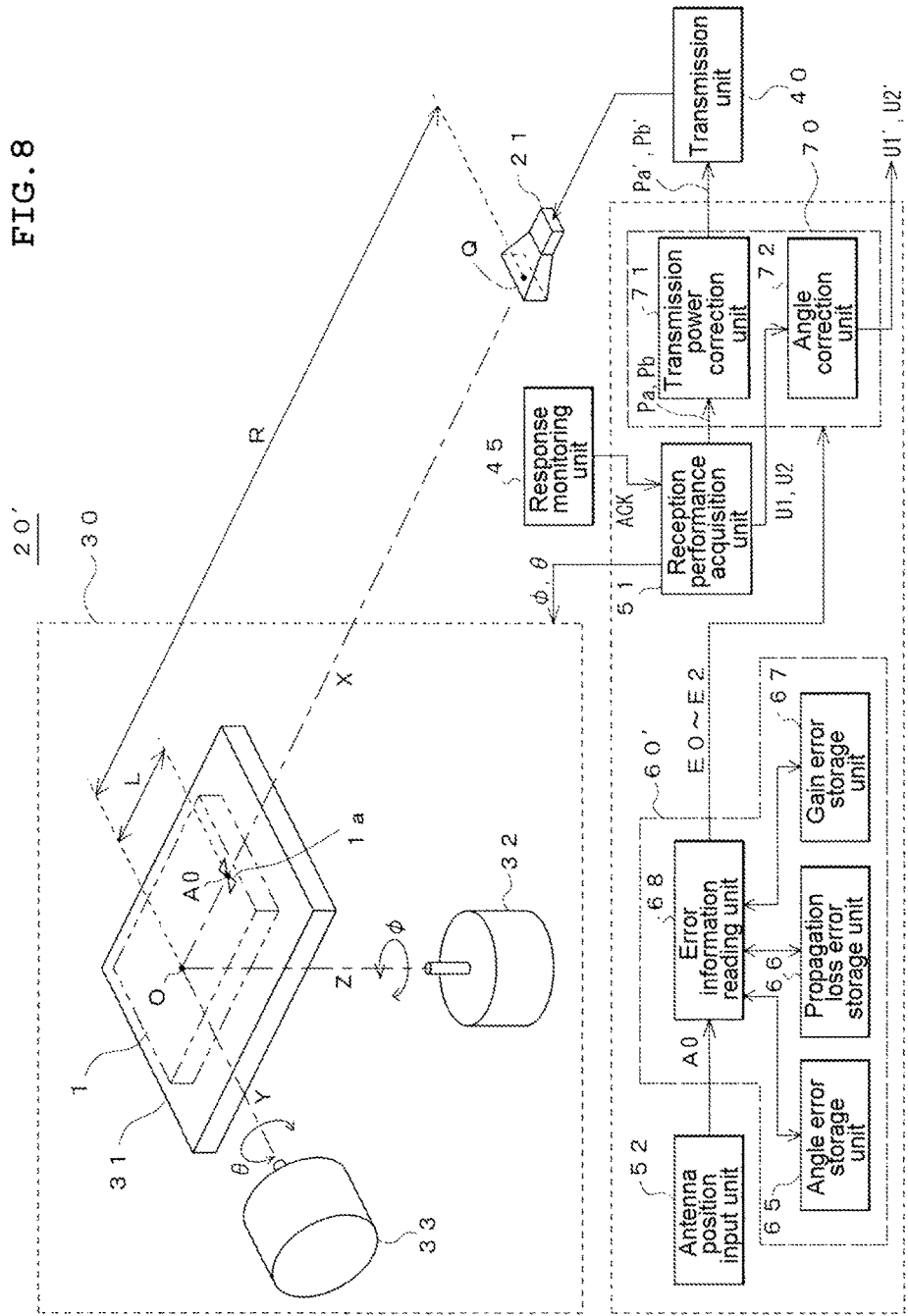
FIG. 8 is a diagram illustrating an entire configuration according to another embodiment of the present invention.

FIG. 8 illustrates a configuration of a measurement system 20' according to this embodiment, which is different from the configuration of the measurement system 20 according to the embodiment described above, in that the measurement system 20' has a different computational processing unit 50'.

That is, the computational processing unit 50' has the reception performance acquisition unit 51, the antenna position input unit 52 and the correction unit 70, as described above, and error information output unit 60', and but the error information output unit 60' is configured with angle error storage unit 65, propagation loss error storage unit 66, gain error storage unit 67, and error information reading unit 68.

The angle error storage unit 65, for example, stores in advance, sets of coordinates A1, A2, and so forth of a plurality of candidate positions capable of becoming positions of the terminal antenna in a case where a wireless terminal that is a measurement target candidate is disposed at the standard position are set in a measurement space represented by an orthogonal coordinate system in which a standard point O is the origin as described above, an angle error (φ', θ') indicating a deviation in a direction of the terminal antenna 1a seen from the phase center Q of the measurement antenna 21 with respect to a standard direction, with respect to each set of the coordinates A1, A2, and so for the plurality of candidate positions, for each of the coordinates A1, A2, and so forth of the plurality of candidate positions, in which the standard direction is a direction of the standard point O seen from the phase center Q of the measurement antenna 21 is stored in advance in the angle error storage unit 65 at each rotation angle (φ, θ) of the wireless terminal 1.

At this point, the coordinates A1, A2, and so forth of the candidate position may be arbitrary coordinates set in a sphere having a predetermined radius Lmax centering around the standard point O, and the radius Lmax may be equal to or shorter than a distance from the standard point to a most distant terminal antenna in a case where the wireless terminal that is a measurement candidate is disposed at the standard position. Here, in reality, at the standard position where the wireless terminal 1 is held is set so that the display operating surface of the wireless terminal 1 is parallel to any one of the XY plane, the YZ plane, and the XZ plane, in many cases, and thus, a probability that the terminal antenna of the wireless terminal 1 is disposed on either axis of the X, Y, and Z axes or in a region in the vicinity thereof is high. Thus, only positions of coordinates included in the region may be set as candidates.

Similarly, in the propagation loss error storage unit 66, a propagation loss error E1(φ, θ) in a free space, that occurs due to a difference between the distance R from the phase center Q of the measurement antenna 21 to the standard point O and the distance Rx from the phase center Q of the measurement antenna 21 to the terminal antenna 1a, is stored in advance at each rotation angle (φ, θ), with respect to each set of the coordinates A1, A2, and so forth of the plurality of candidate positions. In the gain error storage unit 67, a gain error E2(φ', θ') of the measurement antenna calculated using the angle error (φ', θ') and the directional characteristic Hr of the measurement antenna 21 is stored in advance at each rotation angle (φ, θ).

FIG. 9 shows an example of respective errors calculated at each rotation angle with respect to the sets of the coordinates A1, A2, and so forth of the plurality of candidate positions. In FIG. 9, it is assumed that an error E0($i, j, k$) represents a set of angles errors φ', θ' at a rotation angle (φi, θj) is taken with respect to coordinates Ak of a k-th candidate position. Further, errors E1($i, j, k$) and E2($i, j, k$) represent a propagation loss error and a gain error at coordinates of each candidate position.

The error information read-out unit 68 reads an angle error E0, a propagation loss error E1, and a gain error E2 that are stored in advance in the angle error storage unit 65, the propagation loss error storage unit 66, and the gain error storage unit 67 with respect to the coordinates Ak of the candidate position corresponding to a position input through the antenna position input unit 52 among the sets of coordinates A1, A2, and so forth of the plurality of candidate positions described above, and assigns the errors, which are read, to the correction unit 70. In the same manner as in the embodiment described above, with the errors E0 to E2, the correction unit 70 corrects the power values Pa and Pb of the measurement signal that is allocated by the reception performance acquisition unit 51 to the transmission unit 40, using the transmission power correction unit 71, and corrects the reception performance (the temporary reception performance) at each rotation angle, which is attained for the corrected measurement signal, using angle information correction unit 72, and thus calculates the reception performance when it is assumed that the terminal antenna 1a of the wireless terminal 1 is rotated at the position of the standard point O.

In the case of the embodiment, because the error information at each rotation angle, which is necessary for the correction, is stored in advance for each of the candidate positions, the error information necessary for the correction is immediately attained at a stage where the position of the terminal antenna 1a is input. Because of this, the reception performance can be efficiently calculated.

In a case where a set resolution of the coordinates of a candidate position is equal to resolution of a coordinate input value of the position of a terminal antenna, an error that is stored in advance may be read out with respect to the candidate position having the same resolution as that of the coordinate input value is read. Furthermore, in a case where the set resolution of the coordinates of the candidate position is larger than the resolution of the coordinate input value of the position of the terminal antenna, an error that is stored in advance may be read out with respect to a candidate position having a resolution closest to that of the coordinate input value. In this case, the accuracy of each error is slightly lowered, but the number of set candidate positions becomes small, and thus, it is possible to reduce a storage capacity necessary for storage of errors.

Further, a configuration in which the respective error storage unit 65, 66 and 67, and the error information read-out unit 68 are provided in the computational processing unit of the measurement system 20 in FIG. 1, and a determination unit (not shown) determines whether an input position of a terminal antenna is new or is registered, and in a case where the input position is registered in the respective error storage unit 65, 66 and 67, error information corresponding to its coordinates is read out by the error information read-out unit 68 and is given to the correction unit 70 to calculate reception performance, in a case where the position is new, each error is newly calculated in the error calculation unit 61 to the error calculation unit 63 and is assigned to the correction unit 70, and thus the reception performance is calculated. Along with this, the error that is newly calculated and the input position (new candidate position) of the terminal antenna that is input are associated with each other and is registered by the registration means, (not shown), with the error storage means 65 to the error storage unit 67. Thus, a configuration in which storage values in the error storage unit 65 to the error storage unit 67 are sequentially added is also possible.

It is noted that, in the embodiments described above, the case is described where, in order to obtain as the performance value the values U1 and U2 of the throughputs, which result when the measurement signal that has the normal incident powers P1 and P2 is assigned to the wireless terminal, the reception performance acquisition unit 51 allocates the supply powers Pa and Pb that correspond to the incident powers P1 and P2, respectively, to the transmission unit 40. However, it is noted that that, as described above, in a case where the upper limit value P1(φ, θ) and the lower limit value P2(φ, θ) of the incident power of which the throughput is the allowable value (for example, 95%) or above are obtained as the performance values, the reception performance acquisition unit 51 causes the supply power that is allocated to the transmission unit 40, to change while monitoring the throughput and thus obtains the upper limit value P1(φ, θ) and the lower limit value P2(φ, θ), but that, even in such a case, the correction of the error E3 in the gain direction is performed by the correction unit 70 on the supply power that is allocated to the transmission unit 40.

DESCRIPTION OF REFERENCE NUMERALS AND SIGNS 20, 20' SYSTEM FOR MEASURING RECEPTION PERFORMANCE
21 MEASUREMENT ANTENNA
30 TERMINAL HOLDING ROTATION MECHANISM
40 TRANSMISSION UNIT
50, 50' ARITHMETIC-OPERATION PROCESSING UNIT
51 RECEPTION PERFORMANCE ACQUISITION UNIT
52 ANTENNA POSITION INPUT UNIT
60, 60' ERROR INFORMATION OUTPUT UNIT
61 ANGLE ERROR CALCULATION UNIT
62 PROPAGATION LOSS ERROR CALCULATION UNIT
63 GAIN ERROR CALCULATION UNIT
65 ANGLE ERROR STORAGE UNIT
66 PROPAGATION LOSS ERROR STORAGE UNIT
67 GAIN ERROR STORAGE UNIT
68 ERROR Information READING UNIT
70 CORRECTION UNIT
71 TRANSMISSION POWER CORRECTION UNIT
72 ANGLE CORRECTION UNIT

What is claimed is:

1. A wireless terminal reception performance measurement system comprising;
   a measurement antenna having a known directional characteristic, which is fixed at a predetermined position in a measuring space in which entrance of a radio wave from outside and internal reflection of the radio wave are suppressed;
   a terminal holding rotation mechanism that, within the measuring space, uses a point spaced from a phase center of the measurement antenna by a predetermined distance as a standard point, holds a wireless terminal that is a measurement target, in a vicinity of the standard point, and rotates the held wireless terminal centering around the standard point within a region where a distance condition of far field measurement is satisfied from the measurement antenna;
   a transmission unit that supplies a measurement signal to the measurement antenna;
   a response monitoring unit that monitors a response to the measurement signal received through a terminal antenna by the wireless terminal which is held in the terminal holding rotation mechanism;
   a reception performance acquisition unit that rotates the wireless terminal from a standard position by controlling the terminal holding rotation mechanism and acquires a reception performance of the terminal holding rotation mechanism from a response attained at each rotation angle in the response monitoring unit and from a power of the measurement signal input to the terminal antenna of the wireless terminal;
   an antenna position input unit through which a position of the terminal antenna in a case where the wireless terminal is disposed in the standard position in the measuring space, is input;
   an error information output unit that outputs an angle error at each rotation angle of the wireless terminal, which indicates a deviation between a direction of the standard point and a direction of the terminal antenna, when viewed from the phase center of the measurement antenna, a propagation loss error in a free space at each rotation angle of the wireless terminal, which occurs due to a difference between a distance from the phase center of the measurement antenna to the standard point and a distance to the terminal antenna, and a gain error of the measurement antenna at each rotation angle of the wireless terminal, which is determined by the angle error and the directional characteristic of the measurement antenna, based on the input position of the terminal antenna; and
   a correction unit that corrects a power of the measurement signal that is supplied from the transmission unit to the measurement antenna according to the propagation loss error and the gain error that are output from the error information output unit, when the reception performance acquisition unit obtains the reception performance of the wireless terminal, and along with this, corrects the reception performance for the rotation angle acquired by the measurement signal having the corrected power, with the angle error, and obtains the reception performance in a case where it is assumed that the terminal antenna is rotated at a position of the standard point.

2. The wireless terminal reception performance measurement system, according to claim 1,
   wherein the error information output unit includes;
   an angle error calculation unit that calculates the angle error at each rotation angle of the wireless terminal, on the basis of the input position of the terminal antenna,
   a propagation loss error calculation unit that calculates the propagation loss error in the free space at each rotation angle of the wireless terminal, on the basis of the input position of the terminal antenna, and
   a gain error calculation unit that calculates the gain error of the measurement antenna at each rotation angle of the wireless terminal from the angle error at each rotation angle of the wireless terminal calculated by the angle error calculation unit, and from the directional characteristic of the measurement antenna.

3. The wireless terminal reception performance measurement system, according to claim 2,
   wherein the reception performance acquisition unit acquires a reception performance indicating a relationship between a power of the measurement signal that inputs to the terminal antenna, and a throughput that is attained from a response of the wireless terminal, which is monitored in the response monitoring unit, for the measurement signal at each rotation angle of the wireless terminal.

4. The wireless terminal reception performance measurement system, according to claim 3,
   wherein the phase center is a point that is virtually considered as a concentration point of a radio wave in emission and incidence of the radio wave.

5. The wireless terminal reception performance measurement system, according to claim 2,
   wherein the phase center is a point that is virtually considered as a concentration point of a radio wave in emission and incidence of the radio wave.

6. The wireless terminal reception performance measurement system, according to claim 2,
   wherein a frequency that is used for the wireless terminal is in a millimeter-wave band.

7. The wireless terminal reception performance measurement system, according to claim 1,
   wherein the error information output unit includes;

an angle error storage unit that stores, in a state where a plurality of candidate positions capable of becoming the position of the terminal antenna in a case where the wireless terminal that is the measurement target candidate is disposed at the standard position are set in the measuring space, the angle error at each rotation angle of the wireless terminal, that is calculated in advance, with respect to each of the plurality of candidate positions, a propagation loss error storage unit that stores the propagation loss error in the free space at each rotation angle of the wireless terminal, that is calculated in advance, with respect to each of the plurality of candidate positions, a gain error storage unit that stores the gain error of the measurement antenna at each rotation angle of the wireless terminal that is calculated in advance using the angle error stored in the angle error storage unit and the directional characteristic of the measurement antenna with respect to each of the plurality of candidate positions, and an error information read-out unit that reads out the angle error, the propagation loss error and the gain error at each rotation angle of the wireless terminal that are stored in advance in the angle error storage unit, the propagation loss error storage unit, and the gain error storage unit, with respect to a candidate position corresponding to the position input through the antenna position input unit, among the plurality of candidate positions, and assignees the errors that are read, to the correction unit.

8. The wireless terminal reception performance measurement system, according to claim 7,
wherein the reception performance acquisition unit acquires a reception performance indicating a relationship between a power of the measurement signal that inputs to the terminal antenna, and a throughput that is attained from a response of the wireless terminal, which is monitored in the response monitoring unit, for the measurement signal at each rotation angle of the wireless terminal.

9. The wireless terminal reception performance measurement system, according to claim 8,
wherein the phase center is a point that is virtually considered as a concentration point of a radio wave in emission and incidence of the radio wave.

10. The wireless terminal reception performance measurement system, according to claim 7,
wherein the phase center is a point that is virtually considered as a concentration point of a radio wave in emission and incidence of the radio wave.

11. The wireless terminal reception performance measurement system, according to claim 7,
wherein a frequency that is used for the wireless terminal is in a millimeter-wave band.

12. The wireless terminal reception performance measurement system, according to claim 1,
wherein the reception performance acquisition unit acquires a reception performance indicating a relationship between a power of the measurement signal that inputs to the terminal antenna, and a throughput that is attained from a response of the wireless terminal, which is monitored in the response monitoring unit, for the measurement signal at each rotation angle of the wireless terminal.

13. The wireless terminal reception performance measurement system, according to claim 12,
wherein the phase center is a point that is virtually considered as a concentration point of a radio wave in emission and incidence of the radio wave.

14. The wireless terminal reception performance measurement system, according to claim 12,
wherein a frequency that is used for the wireless terminal is in a millimeter-wave band.

15. The wireless terminal reception performance measurement system, according to claim 1,
wherein the phase center is a point that is virtually considered as a concentration point of a radio wave in emission and incidence of the radio wave.

16. The wireless terminal reception performance measurement system, according to claim 1,
wherein a frequency that is used for the wireless terminal is in a millimeter-wave band.

17. A method of measuring a reception performance of a wireless terminal, in which, in a measuring space in which entrance of a radio wave from outside and internal reflection of the radio wave are suppressed, a point spaced by a predetermined distance from a phase center of a measurement antenna having a known directional characteristic, which is fixed at a predetermined position, is used as a standard point, in which a wireless terminal that is a measurement target, which is held in a vicinity of the standard point, is rotated centering around the standard point within a region where a distance condition of far field measurement is satisfied from the measurement antenna, in which a response that receives a measurement signal which is transmitted from the measurement antenna is monitored, through a terminal antenna by the wireless terminal, and in which a reception performance of the wireless terminal is acquired from the response and from a power of the measurement signal that inputs to the terminal antenna of the wireless terminal, the method comprising:

a step of inputting a position of the terminal antenna in a case where the wireless terminal is disposed in the standard position in the measuring space;

a step of outputting an angle error at each rotation angle of the wireless terminal, which indicates a deviation between a direction of the standard point and a direction of the terminal antenna, when viewed from the phase center of the measurement antenna, a propagation loss error in a free space at each rotation angle of the wireless terminal, which occurs due to a difference between a distance from the phase center of the measurement antenna to the standard point and a distance to the terminal antenna, and a gain error of the measurement antenna at each rotation angle of the wireless terminal, which is determined by the angle error and the directional characteristic of the measurement antenna; based on the input position of the terminal antenna; and a step of correcting a power of the measurement signal that is supplied to the measurement antenna according to the propagation loss error and the gain error, when the reception performance is acquired, and along with this, correcting the reception performance for the rotation angle acquired by the measurement signal having the corrected power, with the angle error, and obtaining the reception performance in a case where it is assumed that the terminal antenna is rotated at a position of the standard point.

18. The method of measuring a reception performance of a wireless terminal, according to claim 17,
wherein the step of outputting each of the errors is to calculate the angle error at each rotation angle of the wireless terminal, the propagation loss error, and the gain error, by computation using the input position of the terminal antenna.

19. The method of measuring a reception performance of a wireless terminal, according to claim 17, further comprising:
a step of setting a plurality of candidate positions capable of becoming the positions of the terminal antenna in a case where the wireless terminal that is the measurement target candidate is disposed at the standard position, in the measuring space, calculating and storing in advance the angle error, the propagation loss error, and the gain error of the measurement antenna at each rotation angle of the wireless terminal, with respect to each of the plurality of candidate positions,
wherein the step of outputting each of the errors is to read out the angle error, the propagation loss error, and the gain error that are stored in advance, for a candidate position corresponding to the input position of the terminal antenna among the plurality of candidate positions.

20. The method of measuring a reception performance of a wireless terminal, according to claim 17,
wherein, when the reception performance is acquired, a reception performance indicating a relationship between a power of the measurement signal that inputs to the terminal antenna, and a throughput that is attained from the monitored response of the wireless terminal is acquired at each rotation angle of the wireless terminal.

* * * * *